United States Patent
Uehara et al.

(10) Patent No.: US 7,569,930 B2
(45) Date of Patent: Aug. 4, 2009

(54) SEMICONDUCTOR MODULE AND RADIATOR PLATE

(75) Inventors: Sumio Uehara, Nagano (JP); Shuzo Aoki, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 464 days.

(21) Appl. No.: 11/555,706

(22) Filed: Nov. 2, 2006

(65) Prior Publication Data

US 2007/0102808 A1 May 10, 2007

(30) Foreign Application Priority Data

Nov. 4, 2005 (JP) .............................. 2005-320826

(51) Int. Cl.
*H01L 23/34* (2006.01)
(52) U.S. Cl. ...................... 257/712; 257/717
(58) Field of Classification Search ......... 257/703–722, 257/E23.051
See application file for complete search history.

(56) References Cited

U.S. PATENT DOCUMENTS

| 5,767,576 A | * | 6/1998 | Kobayashi et al. | ........... 257/701 |
| 2006/0060982 A1 | * | 3/2006 | Ikawa et al. | ................. 257/779 |
| 2006/0113661 A1 | * | 6/2006 | Yamabuchi et al. | ......... 257/706 |

FOREIGN PATENT DOCUMENTS

JP  2001-196516  7/2001

* cited by examiner

*Primary Examiner*—Cuong Q Nguyen
(74) *Attorney, Agent, or Firm*—Rankin, Hill & Clark LLP (57) ABSTRACT

A semiconductor module 10 in which respective upper surfaces of semiconductor elements 17, 17 on both sides of a rectangular circuit board 11 are covered with radiator plates 12a, 12b attached to both sides of the circuit board 11 so that their outer peripheral edges are not projected from the board surfaces of the circuit board 11. In this semiconductor module, by projections serving as a pair of attachments 42, 42 formed in the vicinity of the center area in a longitudinal direction of the circuit board 11, the radiator plates 12a, 12b are located at predetermined positions. The projections abuts on the corresponding board surface of the circuit board 11 so that a part of the load applied to the vicinity of the center area of each the radiator plates 12a, 12b can be supported by the circuit board 11.

11 Claims, 12 Drawing Sheets

SEMICONDUCTOR MODULE AND RADIATOR PLATE

BACKGROUND OF THE INVENTION

1. Field of the Invention

This invention relates to a semiconductor module and a radiator plate used therein, and more particularly to a semiconductor module and a radiator plate used therein in which respective upper surfaces of semiconductor elements on both sides of a rectangular circuit board are covered with the rectangular radiator plates.

2. Description of Related Art

The semiconductor module, in which respective upper surfaces of semiconductor elements on both sides of a rectangular circuit board are covered with rectangular radiator plates, is disclosed in e.g. Japanese Patent Unexamined Publication JP-A-2001-196516.

Figure 16A:
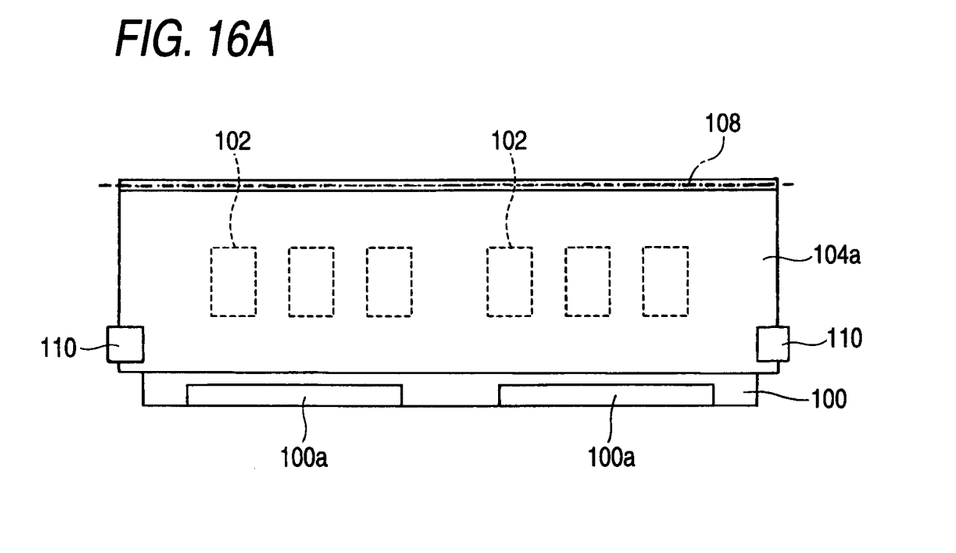
FIGS. 16A to 16C are explanation view for explaining a related art semiconductor module.
Figure 16B:
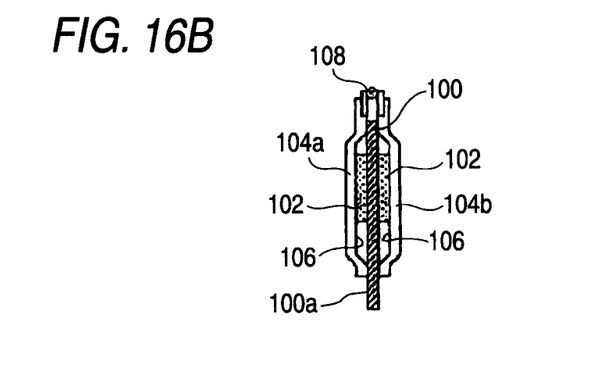
Figure 16C:
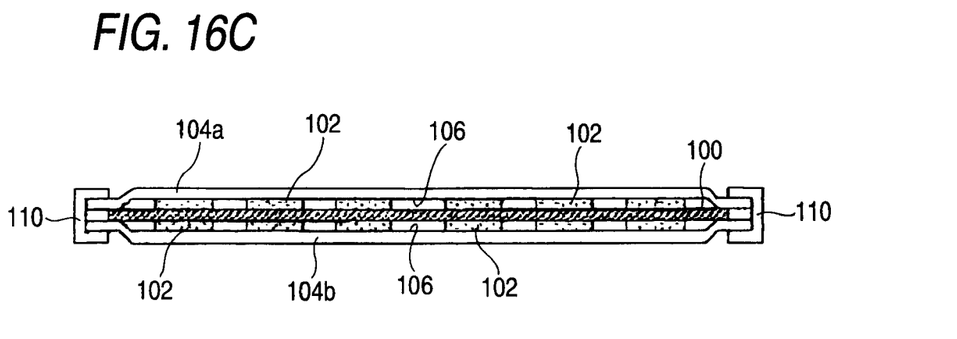

Such a semiconductor module is shown in FIG. 16. FIG. 16A is a front view of the semiconductor module. FIG. 16B is a transverse sectional view of the semiconductor module. FIG. 16C is a longitudinal sectional view of the semiconductor module.

On a rectangular circuit board 100 constituting the semiconductor module shown in FIG. 16, in the longitudinal direction on both sides thereof, a plurality of semiconductor elements 102, 102, ... are loaded. At one of the outer peripheral edges along the longitudinal direction, card-edge connectors 100a, 100a are formed. These semiconductor elements 102, 102, ... are accommodated in accommodating recesses 106 formed in the rectangular radiator plates 104a, 104b attached to board surfaces of the circuit board 100, respectively. The upper surfaces semiconductor elements 102, 102, thus accommodated abut on a bottom surface of the accommodating recess 106. Further, vicinity of an outer peripheral edge of the accommodating recess 106 abuts on the board surface of the circuit board 100 over an entire periphery of the accommodating recess 106.

These radiator plates 104a, 104b are coupled to each other at one of their longer sides in the longitudinal direction pivotally via a hinge 108. The area between the outside of the accommodating recess 106 and the outer peripheral edge of the radiator plate is partially bent so as to abut on the corresponding board surface of the circuit board 100.

These radiator plates 104a, 104b, as seen from FIGS. 16B and 16C, are larger than the circuit board 100. Therefore, as shown in FIG. 16A, both sides of the circuit board 100 are covered with the radiator plates 104a, 104b. Thus, the edge connectors 100a, 100a of the circuit board 100 are exposed and mounting clips 110 on the areas of the radiator plates 104a, 104b projected from the circuit board 100, the radiator plates 104a, 104b can be attached to both side of the circuit board 100.

In the semiconductor module shown in FIG. 16, the radiator plates 104a, 104a can be easily attached to both sides of the circuit board 100.

However, the radiator plates 104a, 104b of the semiconductor module shown in FIG. 16 are attached so that they project from the outer peripheral edges of the circuit board 100.

On the other hand, in a memory module for expansion or addition for a server computer or personal computer, which is generally employed as a semiconductor module, it has been demanded for its miniaturization that the radiator plates are attached to the outer peripheral edges of the circuit board.

Further, in the semiconductor module shown in FIG. 16, the vicinity of the outer peripheral edge of the accommodating recess 106 in the radiator plate 104a, 104b abuts on the board surface of the circuit board 100 over the entire periphery of the accommodating recess 106. Therefore, an abutting area, on which a part of the radiator plate 104a, 104b abuts, must be assured on the board surface of the circuit board 100. This gives rise to a limit for miniaturization of the circuit board 100.

On the other hand, if this accommodating recess 106 is not substantially formed to reduce the contact area between the radiator plate 104a, 104b and the circuit board 100 to the utmost, the semiconductor module can be miniaturized. However, in this case, the semiconductor elements suffer from load applied to the radiator plates. Particularly, at the semiconductor element loaded in the vicinity of the center area of the circuit board 100, the load applied to the radiator plates is apt to concentrate. So when the semiconductor element with low strength is loaded, the semiconductor element may be broken.

SUMMARY OF THE INVENTION

Accordingly, an object of this invention is to provide a semiconductor module in which a radiator plate can be firmly attached to a circuit board without being projected from the outer peripheral edge of the circuit board and anxiety of breakage of a semiconductor element loaded in the vicinity of the center area of the circuit board owing to load applied to the radiator plate can be resolved even if an area of the radiator plate abutting on the circuit board is reduced to the utmost, and to provide the radiator plate used in the semiconductor module.

The inventors of this invention have done research in order to solve the above problems, and found that the radiator plate can be located at a predetermined position of the circuit board by engagement of a projection formed in a vicinity of an outer peripheral edge in the vicinity of a center area of the radiator plate and a through-hole formed in an area of the circuit board where no wiring pattern is formed, and a part of load applied to the vicinity of a center area of the radiator plate can be supported by the circuit board by abutment of a part of the projection formed in the radiator plate on the corresponding board surface of the circuit board. Thus, the inventors have reached this invention.

Specifically, in accordance with this invention, there is provided a semiconductor module comprising:

a rectangular circuit board comprising a conductive circuit having a via and a wiring pattern on a board surface thereof;

semiconductor elements provided on both surfaces of the circuit board;

rectangular radiator plates that are attached to the respective surfaces of the circuit board and that covers upper surfaces of the semiconductor elements so that outer peripheral edges of the radiator plate does not project from the circuit board; and a through hole or a notch formed on a portion of the circuit board, the portion being positioned at a longitudinally center area and a vicinity of the outer peripheral edge where the conductive circuit is not formed, wherein a part in the vicinity of the outer peripheral edge of each the radiator plates is bent so as to abut on the board surface in the vicinity of the outer peripheral edge of the circuit board, a projection projecting toward the through-hole or the notch is formed at a position of the radiator plate corresponding to the through-hole or the notch of the circuit board, the projection is engaged into the through-hole or the notch directly or by an engaging member so that the radiator plate is located at a predetermined position of the circuit board, and a part of the projection abuts on the corresponding board surface of the circuit board.

Further, according to another aspect of the invention, there is provided a radiator plate for a semiconductor module, wherein the rectangular radiator plate is attached to both surfaces of a board circuit so as to cover upper surfaces of semiconductor elements arranged on both surfaces of a rectangular board circuit, on which a conductive circuit having a via and a wiring patter formed, in such a manner that an outer peripheral edge of the radiator plate does not protrude from the circuit board, a part of the radiator in a vicinity of the outer peripheral edge of the radiator plates is bent so as to abut on the board surface in a vicinity of the outer peripheral edge of the circuit board, a projection projecting toward the circuit board is formed on the radiator plate at a position corresponding to a through-hole or a notch, which is formed on the circuit board at a position in a vicinity of a longitudinally center area and a vicinity where the conductive circuit is not formed, so that the radiator plates is located at a predetermined position of the circuit board.

Further, the projection may be engaged into the through-hole or notch directly or by an engaging member at two points. Accordingly, the radiator plate is more precisely located in the predetermined position.

Furthermore, a tip of the projection of each the radiator plates may be inserted into the through-hole or notch formed in the circuit board so that each the radiator plates is located at a predetermined position of the circuit board and the remaining portion of the projection may abut on the corresponding board surface of the circuit board. Accordingly, a part of the load applied to the central area of the radiator plate can be received on the circuit board.

Still further, the radiator plates may be attached on both sides of the circuit board by a clip. Accordingly, the radiator plate can be firmly attached to the circuit board by the clip.

In addition, notch grooves may be formed on the circuit board and the radiator plates so that an outer peripheral edge of the clips is not projected from the outer peripheral edge of the circuit board when the clips are mounted. Accordingly, it can be prevented that the clip protrude from the outer peripheral edge of the circuit board.

Further, an attaching structure of the circuit board and the radiator plates may comprise:

the attachment hole formed at an attaching edge where which is positioned a vicinity of the outer peripheral edge of the circuit board and where the conductive circuit is not formed; and a securing part that is formed of respective portions of the radiator plates corresponding to the attachment hole and that caulks the radiator plates to the circuit board through the attachment hole. Accordingly, the radiator plate can be attached to the circuit board securely without using the clip.

Furthermore, among the semiconductor elements arranged along with the longitudinal direction of the circuit board, the upper surface of one of the semiconductor elements positioned in the vicinity of the center area of the circuit board may be located at a position higher than those of the other semiconductor elements, and the vicinity of the center area of the radiator plates may be bent so as to abut on the upper surface of the semiconductor element in the vicinity of the center area of the circuit board.

Still further, among the semiconductor elements arranged along with the longitudinal direction of the circuit board, one of them may be a high-heat semiconductor element generating more heat than the other semiconductor elements, and at least one air bent may be formed in a vicinity of an outer peripheral edge of an area of the radiator plates contacting with an upper surface of the high-heat semiconductor element. Accordingly, heated air surrounding the high-heat semiconductor element can be exhausted by the air hole quickly.

Additionally, when the radiator plate is attached to the board surface of the circuit board, a tip of the projection formed on the radiator plate may be formed as an insertion portion, which is inserted into the through-hole or the notch of the circuit board, and the remaining part of the radiator plate may be formed as an abutment surface, which abuts on the corresponding board surface of the circuit board.

In addition, a thermal conductive member may be disposed between the radiator plate and the semiconductor element. Accordingly, the heat generated in the semiconductor element can be transmitted to the radiator plate efficiently.

In accordance with this invention, by engagement of a projection formed in the vicinity of an outer peripheral edge in the vicinity of a center area of each of the radiator plates deposited on both sides of a rectangular circuit board and a through-hole or notch formed in an area of the circuit board where no wiring pattern is formed, the radiator plate can be located at a predetermined position of the circuit board. Therefore, by previously forming the projection in the radiator plate and the through-hole or notch in the circuit board at positions where the radiator plate can be attached without being projected from the outer peripheral edge of the circuit board, the radiator plate can be located at a predetermined position of the circuit board where the radiator plate can be attached without being projected from the outer peripheral edge of the circuit board.

Further, a part of the vicinity of the outer peripheral edge of the radiator plate is bent so that it abuts on the board surface in the outer peripheral edge of the circuit board, and also a part of the projection formed in the radiator plate abuts on the corresponding board surface of the circuit board. Therefore, the greater part of the load applied to the radiator plate can be received by the circuit board. This dissolves anxiety of breakage of the semiconductor elements loaded on the circuit board owing to the load applied to the radiator plate.

In this way, in the semiconductor module according to this invention, the radiator plate can be firmly attached to the circuit board without being projected from the outer peripheral edge of the circuit board. Further, even if the area of the radiator plate abutting on the circuit board is reduced to the utmost, anxiety of breakage of the semiconductor elements loaded on the circuit board owing to the load applied to the radiator plate can be resolved. As a result, a miniaturized and reliable semiconductor module can be provided.

DETAILED DESCRIPTION OF THE PREFERRED EMBODIMENTS

Figure 1A:
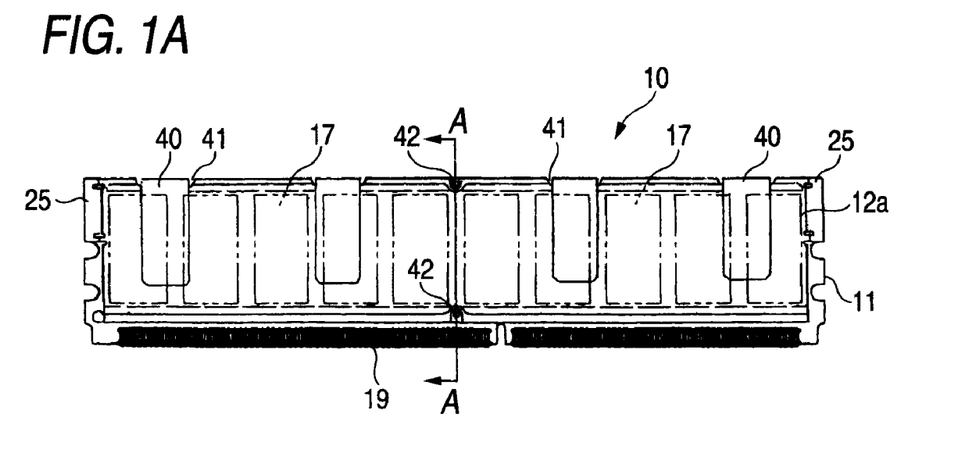
FIGS. 1A and 1B are front views of an example of the semiconductor module according to this invention.
Figure 1B:
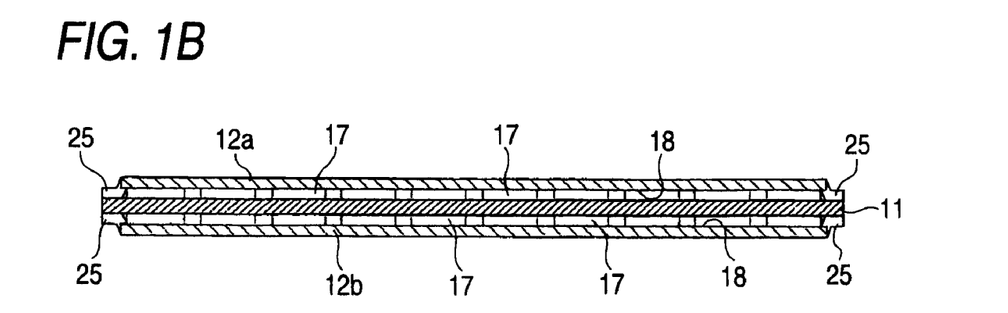

An example of a semiconductor module according to this invention is shown in FIG. 1. In a semiconductor module 10 shown in FIG. 1, on each of board surfaces of a rectangular circuit board 11 of resin, a plurality of semiconductor elements 17, 17, . . . are arranged along with the longitudinal direction. At the one end along the longitudinal direction of the circuit board 11, a card-edge connector 19 is formed.

Metallic radiator plates 12a, 12b are attached to the board surfaces of the circuit board 11, respectively. The respective board surfaces of the circuit board 11 are covered with the radiator plates 12a, 12b except the card edge connector 19 and areas in the vicinity of the distal edges along the short axis of the circuit board 11. The areas in the vicinity of the distal edges along the short axis of the circuit board 11 correspond to securing areas where the semiconductor module 10 is secured to a circuit board (mother board) of a personal computer.

The radiator plate 12a, 12b is formed to provide bent portions 25, 25 where areas in the vicinity of both distal edges along the short axis are bent. The bent portions 25, 25 abut on the corresponding board surface of the circuit board 11. The surface of the radiator plate 12a, 12b except these bent portions 25, 25, opposite to the board surface of the circuit board 11 is flat and abuts on the upper surface of the semiconductor elements 17, 17, . . . through a thermal-conductive tape (not shown).

That is, the thermal conductive-tape is disposed between the semiconductor elements 17, 17, . . . and the circuit board 11.

The radiator plate 12a, 12b, as seen from FIG. 1A, is firmly attached to the circuit board 11 through its sandwiching by a pair of attachments 42, 42 provided in the vicinity of the outer peripheral edge near the center area of the heat-dissipating plate 12a, 12b and clips 40, 40, In areas of the radiator plate 12a, 12b and the circuit board 11 where these clips 40, 40, . . . are mounted, as seen from FIG. 1A, recess grooves 41 are formed. Therefore, in the semiconductor module 10 completed, it is possible to prevent the outer peripheral edge of the clip 40, 40, . . . from projecting from the outer peripheral edge of the circuit board 11.

Figure 2:
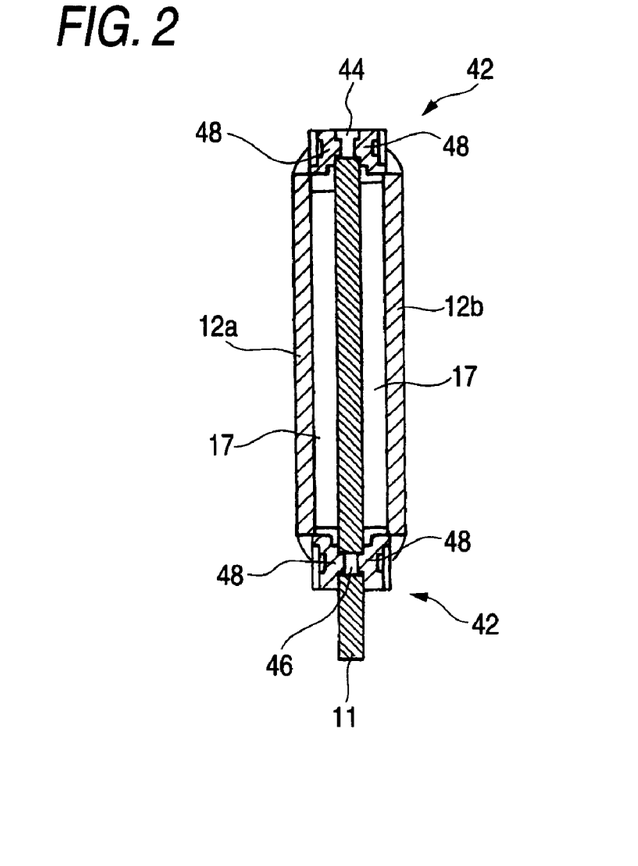
FIG. 2 is a transverse sectional view taken in line A-A in FIG. 1.

Further, as seen from FIG. 2 showing the transverse section taken in line A-A in FIG. 1A, in the pair of attachments 42, 42, the tips of column-like projections 48, 48 formed in the vicinity of the outer peripheral edge near each the center areas of the radiator plates 12a, 12b are inserted into a recess 44 and through-hole 46 formed in the corresponding areas of the circuit board 11, and the flat surface encircling the tips of the projections 48, 48 abut on the board surfaces of the circuit board 11. The recess 44 and through-hole 46 of the circuit board 11 are formed in the areas where a conductive circuit composed of a via and a wiring pattern is not formed.

By the pair of attachments 42, 42, the radiator plates 12a, 12b can be located on and attached to predetermined portions of the circuit board 11. This prevents the radiator plates 12a, 12b from being attached in a manner projected from the outer peripheral edges of the circuit board 11.

Further, the flat faces of the tips of the projections 48 constituting the pair of attachments 42, 42 abut on the board surfaces of the circuit board 11. Thus, in corporation with the fact that the bent portions 25, 25, which is formed by bending a part in the vicinity of the both distal edges of the radiator plate 12a, 12b along the short axis thereof, abut on the corresponding board surfaces of the circuit board 11, almost any load applied to the radiator plates 12a, 12b can be received by the circuit board 11. This dissolves anxiety of breakage of the semiconductor elements 17, 17, . . . on the circuit board 11 owing to the load applied to the radiator plates 12a, 12b.

Note that the projections 48, 48, . . . of the radiator plates 12a, 12b can easily be formed by press working.

Figure 3A:
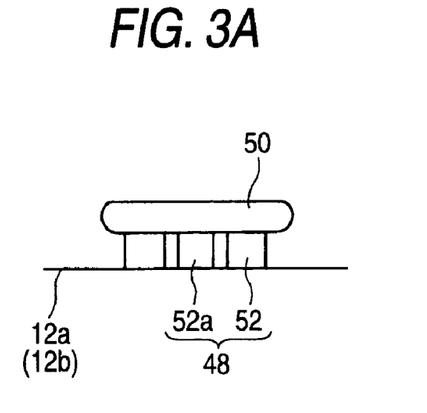
FIGS. 3A and 3B are explanation views for explaining another example of a projection 48 constituting an attachment 42.
Figure 3B:
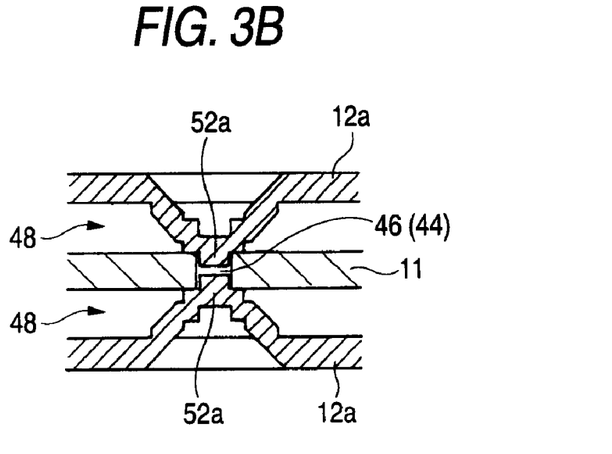

Although the projections 48 constituting the pair of attachments 42, 42 shown in FIGS. 1 and 2 are formed in a column-like, they may be formed in the shape as shown in FIG. 3. The projection 48 shown in FIG. 3 is a belt-like projection formed in a belt-like portion 52 between a slit 50 along the outer peripheral edge of the radiator plate 12a, 12b and the outer peripheral edge. The entire center segment of the belt-like portion 52 projects to form a square pillar-like tip 52a. The status where the tip 52a of the projection 48 shown in FIG. 3A is inserted into the through-hole 46 of the circuit board 11 is shown in FIG. 3B. In the projection 48 shown in FIG. 3A, the flat surface formed on both sides of the square pillar-like tip 52a abuts on the board surface of the circuit board 11.

Figure 4A:
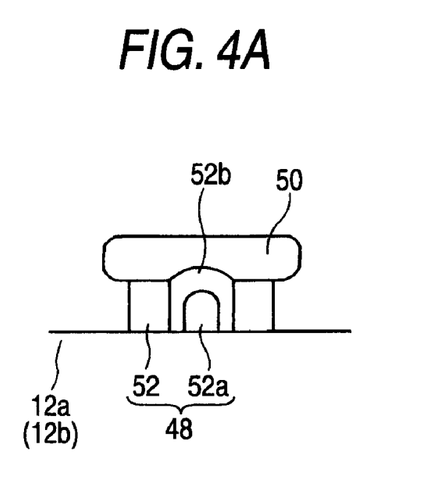
FIGS. 4A and 4B are explanation views for explaining another example of a projection 48 constituting an attachment 42.
Figure 4B:
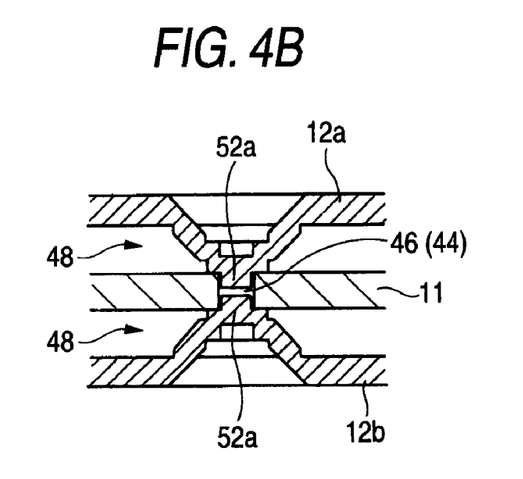

In the projection 48 shown in FIG. 3, since the entire center segment of the belt-like portion 52 projects to form the square pillar-like tip 52a, shortage of strength may occur. In this case, as seen from FIG. 4A, the center segment of the belt-like portion 52 is projected to form the tip 52a with the edge 52b thereof being left, thereby permitting the strength of the projection 48 to be increased. The status where the tip 52a of the projection 48 shown in FIG. 4A is inserted into the through-hole 46 of the circuit board 11 is shown in FIG. 4B. In the projection 48 shown in FIG. 4A, the flat surface formed on both sides of the square pillar-like tip 52a abuts on the board surface of the circuit board 11.

At the pair of attachments 42, 42 of the semiconductor module 10 shown in FIGS. 1 to 4, since the square pillar-like tip of the projection 48 formed in each of the radiator plates 12a, 12b is only inserted into the notch 44 or through-hole 46 of the circuit board 11, the radiator plates 12a, 12b must be firmly attached to the board surfaces of the circuit board 11 using the clips 40, 40, . . . , respectively.

On the other hand, if the radiator plates 12a, 12b can be firmly attached to the board surfaces of the circuit board 11 by the pair of attachments 42, 42, the clips 40, 40, . . . becomes unnecessary.

Figure 5A:
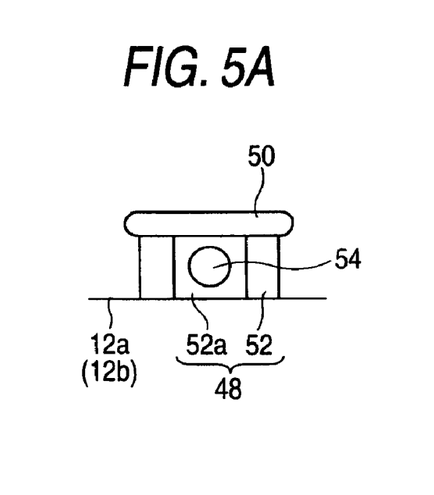
FIGS. 5A and 5B are explanation views for explaining still another example of a projection 48 constituting an attachment 42.
Figure 5B:
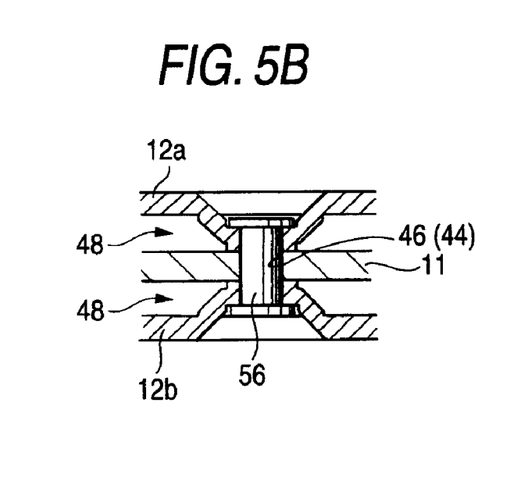

An example of the pair of attachments 42, 42, which eliminates the use of the clips 40, 40, . . . , is shown in FIG. 5. The projection 48 formed in the radiator plate 12a, 12b constituting the pair of attachments 42, 42 may be a belt-like projection formed in the belt-like portion 52 between the outer peripheral edge of the radiator plate 12a, 12b and the slit 50, in which a slot 54 is formed at the center thereof.

By aligning the slot 54 at the center of the belt-like projection shown in FIG. 5A with the notch 44 or the through-hole 46 of the circuit board 11 and thereafter, as seen from FIG. 5B, by crushing both ends of a rivet 56 serving as a securing member passed through the notch 44 or through-hole 46 of the circuit board 11 and the slot 54 of the radiator plate 12a, 12b, the radiator plates 12a, 12b can be firmly attached to the circuit board 11.

Figure 6A:
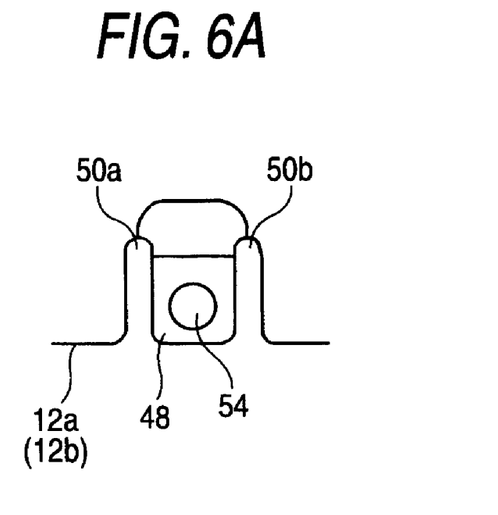
FIGS. 6A and 6B are explanation views for explaining a further example of a projection 48 constituting an attachment 42.

Although the projection 48 formed in the radiator plate 12a, 12b shown in FIG. 5 is formed between the slit 50 formed along the outer peripheral edge of the radiator plate 12a, 12b and the outer peripheral edge thereof, as seen from FIG. 6A, it maybe formed in a tongue shape between slits 50a, 50b formed perpendicularly to the outer peripheral edge of the radiator plate 12a, 12b. At the center of the projection 48 shown in FIG. 6A, as seen from FIG. 6B, the slot 54 through which the rivet 56 is passed is formed.

Figure 7A:
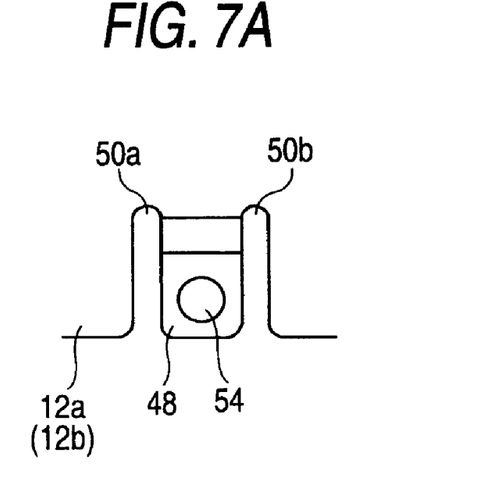
FIGS. 7A and 7B are explanation views for explaining a still further example of a projection 48 constituting an attachment 42.
Figure 7B:
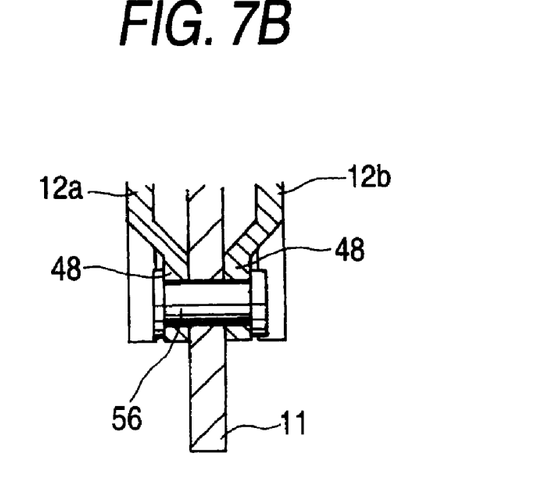

Further, FIG. 7A shows the status where slits 50a, 50b longer than the slits 50a, 50b shown in FIG. 6A are formed to provide a tongue-like projection 48. FIG. 7B shows the status where the radiator plates 12a, 12b are firmly attached to the circuit board 11 by the rivet 56 passed through the slot 54 formed at the center of the projection 48 shown in FIG. 7A.

Figure 6B:
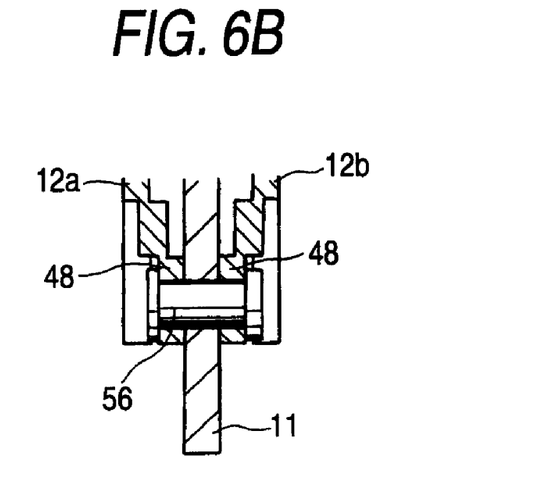

In the examples shown in FIGS. 5 to 7, the rivet 56 is employed as a securing member for firmly attaching the radiator plates 12a, 12b to the circuit board 11, a screw may be employed in place of the rivet 56.

Figure 8:
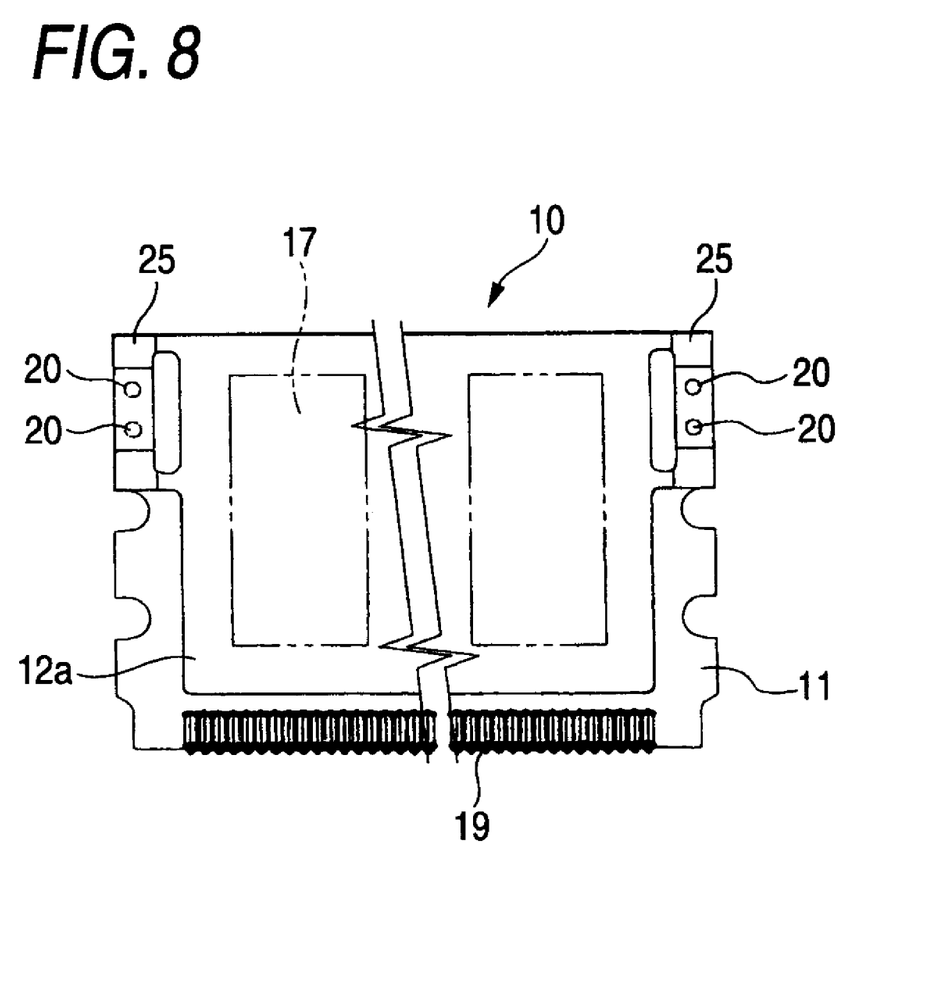
FIG. 8 is an explanation view for explaining an example of the fixing part using bent portions 25, 25 of radiator plates 12a, 12b.

Further, in FIGS. 5 to 7, by using the pair of attachments 42, 42, the radiator plates 12a, 12b are firmly attached to the circuit board 11. However, by using the bent portions 25, 25 where areas in the vicinity of both distal edges along the short axis of each the radiator plates 12a, 12b are partially bent shown in FIG. 1, the radiator plates 12a, 12b can be firmly attached to the circuit board 11 without using the clips 40. An example of such a configuration is shown in FIG. 8. In each the bent portions 25, 25 shown in FIG. 8, a fixing part 20 is provided. On the one side of the bent portions 25, 25, shown in FIG. 9A, the fixing part 20 is provided with projections 21, 21 as seen from FIG. 9B which is a sectional view taken in line B-B in FIG. 9A. On the other side of the bent portions 25, 25, shown in FIG. 9A, the fixing part 20 is provided with engaging holes 30, 30 as seen from FIG. 9C which is a sectional view taken in line C-C in FIG. 9A.

Figure 10:
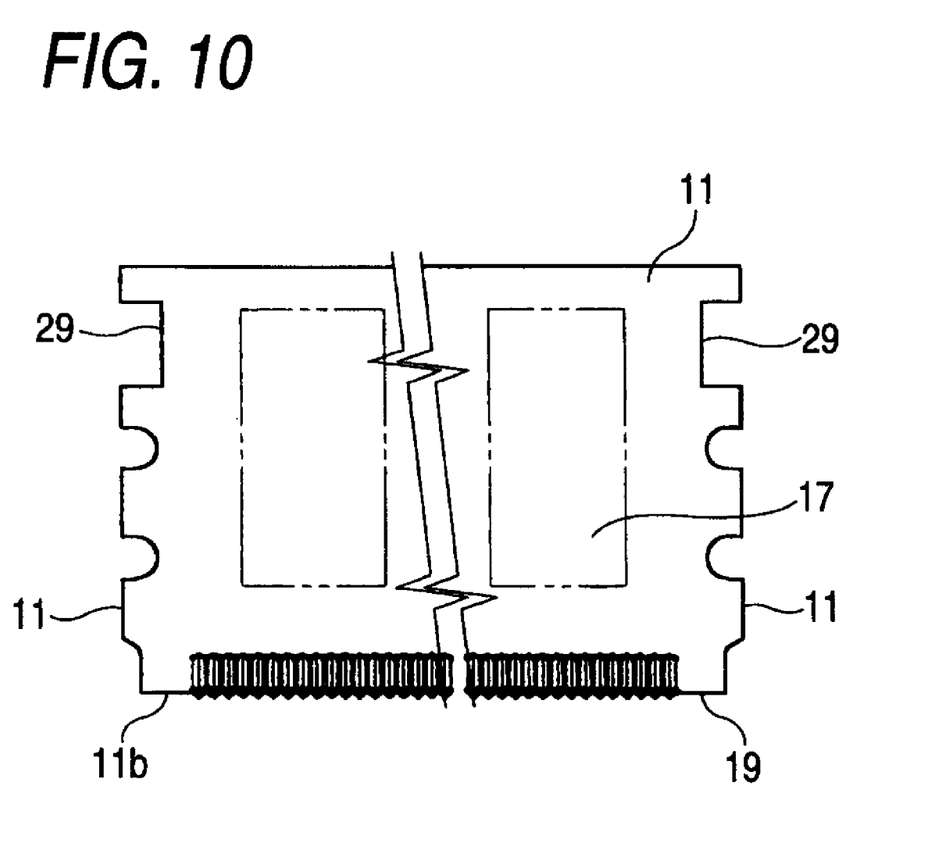
FIG. 10 is a partial front view for explaining the configuration of a circuit board 11 sandwiched by the bent portions 25, 25 of the radiator plates 12a, 12b.

Further, in the circuit board 11 corresponding to the bent portions 25 of the radiator plates 12a, 12b on which the fixing part 20, 20 are formed, as seen from FIG. 10, notches 29, 29 are formed.

Figure 9A:
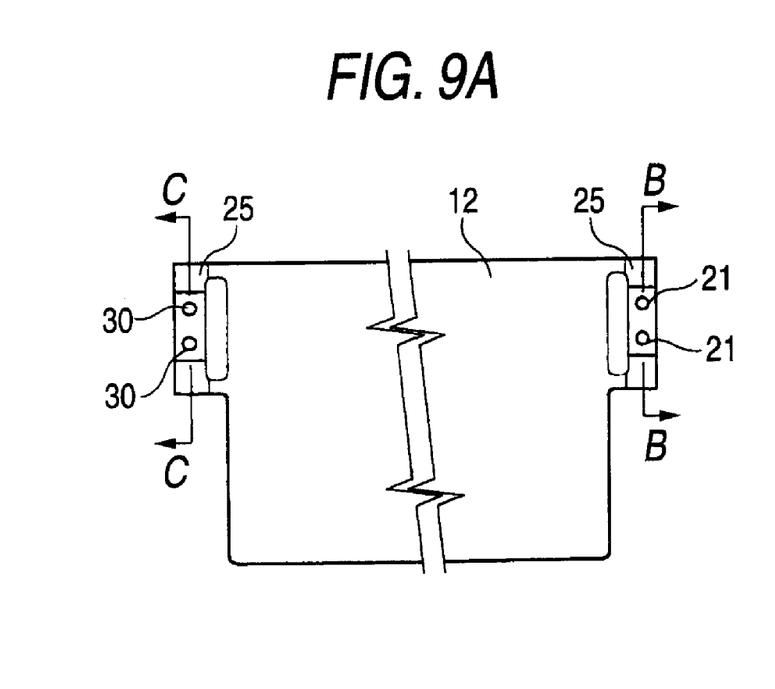
FIGS. 9A to 9C are explanation views for explaining bent portions 25, 25 of the radiator plates 12a, 12b.
Figure 9B:
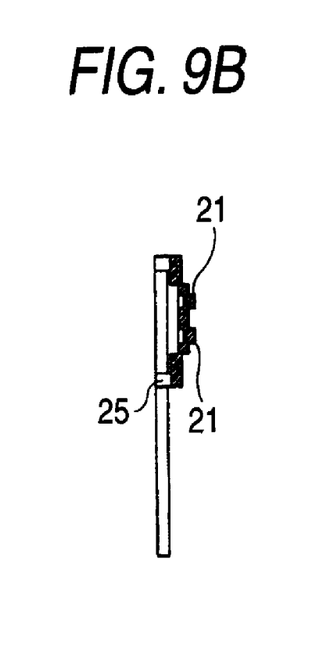
Figure 9C:
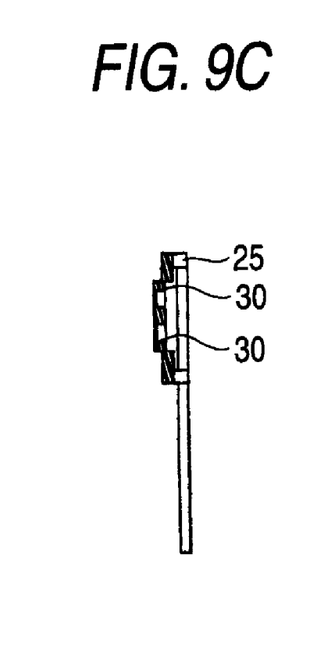
Figure 11:
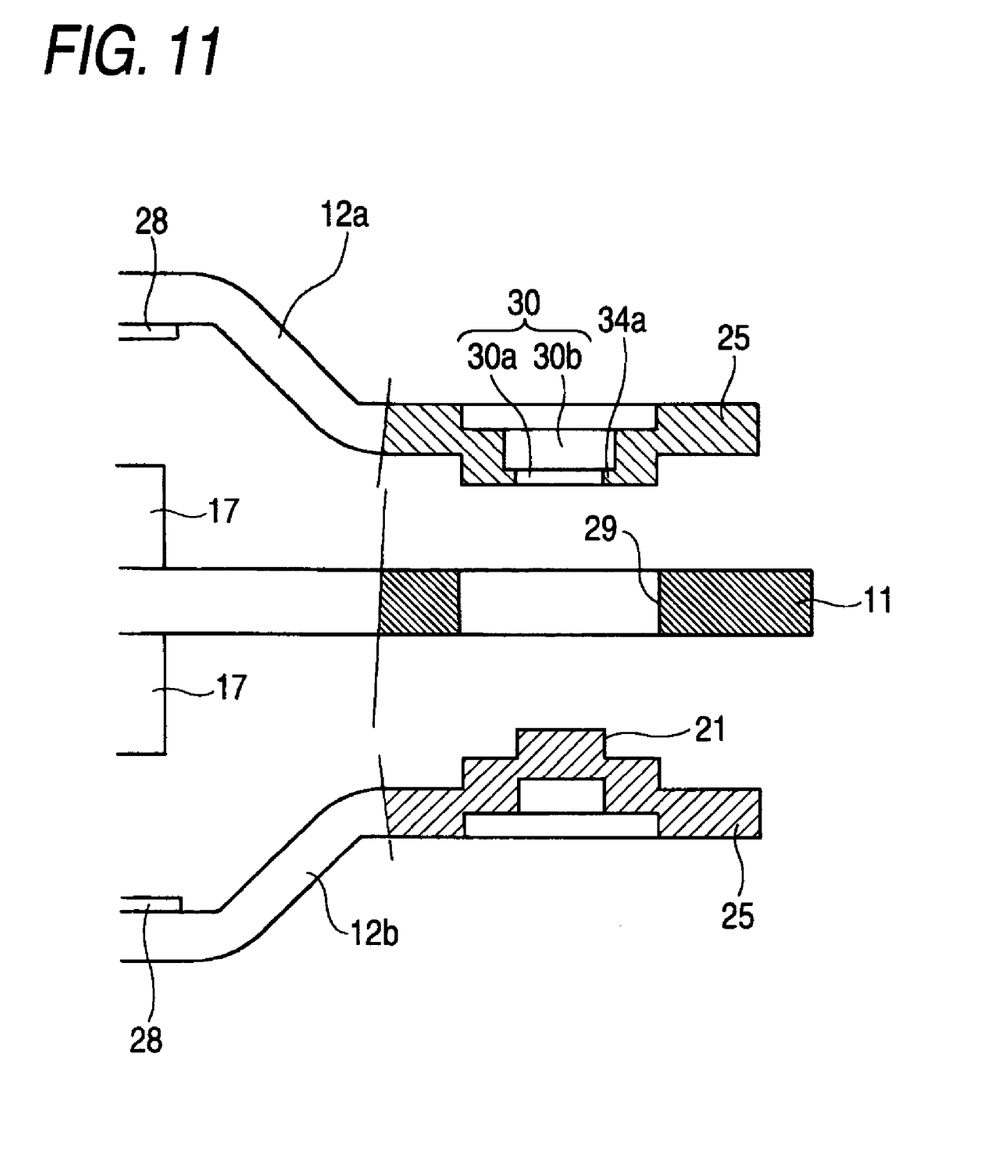
FIG. 11 is a partial enlarged sectional view for explaining the assembled status of the bent portions 25, 25 of the radiator plates 12a, 12b and the circuit board 11.

In attaching the radiator plates 12a, 12b shown in FIG. 9 to the circuit board 11, as seen from FIG. 11, the projection 21 formed in the bent portion 25 of the radiator plate 12a and the engaging hole 30 formed in the bent portion 25 of the radiator plate 12b are caused to face each other through the notch 29 of the circuit board 11 on which the semiconductor elements 17, 17, . . . are loaded. In this case, on the side of the circuit board 11 of the radiator plates 12a, 12b, thermal-conductive tapes 28 are bonded.

The engagement slot 30 of the radiator plate 12a shown in FIG. 11 is composed of an inserting slot 30a in which the projection 21 of the radiator plate 12b is to be inserted and another slot 30b having a larger diameter than the inserting slot 30a. These slots are formed on the side of the circuit board 11 of a protrusion projecting from the bent portion 25. Thus, a stepped face 34a is formed on the side of the slot 30b of the engaging hole 30.

Figure 12:
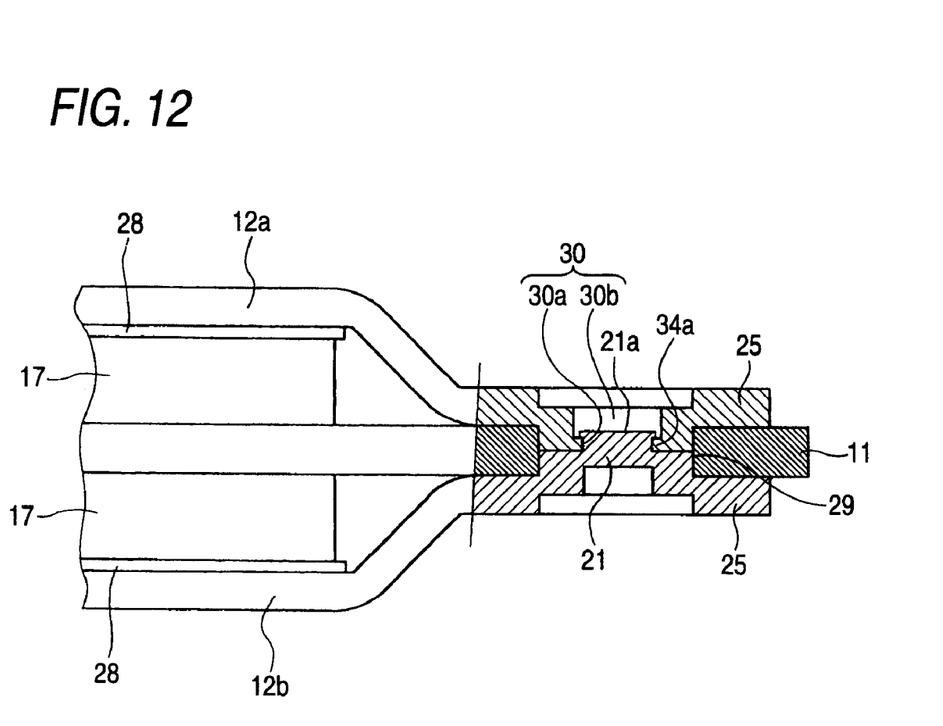
FIG. 12 is a partial enlarged sectional view for explaining the assembled status of the bent portions 25, 25 of the radiator plates 12a, 12b and the circuit board 11.

By inserting the projection 21 of the radiator plate 12b as shown in FIG. 11 into the inserting slot 30a of the engaging hole 30 of the radiator plate 12a and caulking processing of crushing the tip of the projection 21 projected from the inserting slot 30a into the slot 30b, a crushed area 21a having a larger diameter than the inserting slot 30a can be formed as shown in FIG. 12. The crushed area 21a is engaged with the stepped face 34a so that the radiator plates 12a, 12b and the circuit board 11 are firmly caulked. In this case, the upper surface of each of the semiconductor elements 17, 17, . . . loaded on the circuit board 11 abuts on the thermal conductive tape 28 so that the greater part of heat generated from the semiconductor elements 17, 17, . . . is dissipated from the radiator plate 12a, 12b through the thermal conductive tape 28.

The engaging hole 30 of the radiator plate 12a shown in FIGS. 11 and 12 is formed in the protrusion projecting from the bent portion 25. However, as seen from FIG. 13, the engaging hole 30 may be formed without forming the protrusion in the bent portion 25. In this engaging hole 30, the inserting slot 30a having a smaller diameter than the slot 30b is formed on the side of the circuit board 11. On the bottom side of the slot 30b, the stepped face 34a is formed.

Figure 13:
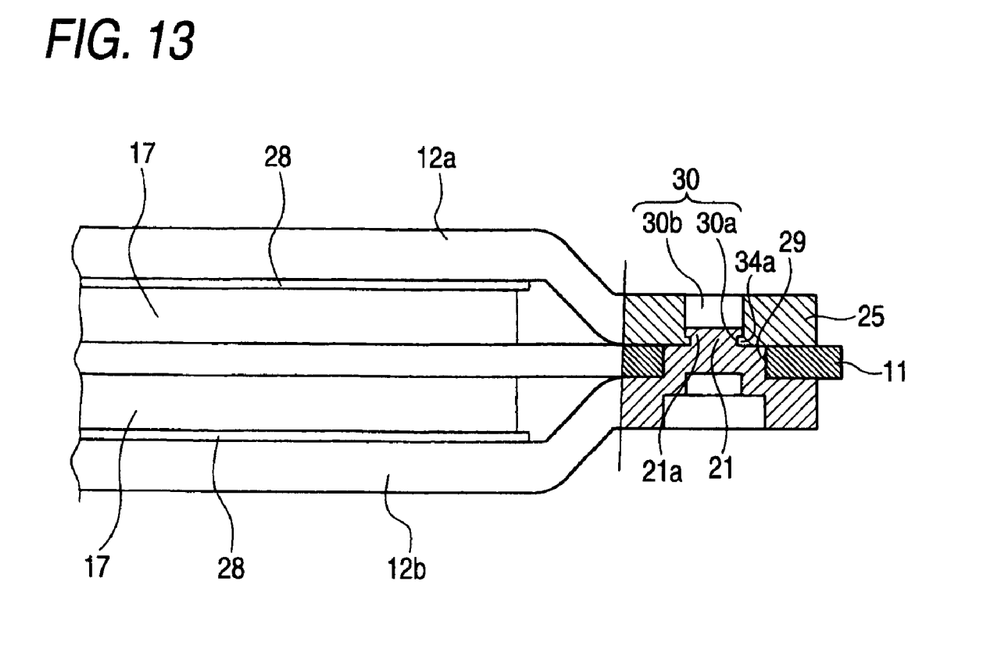
FIG. 13 is a partial enlarged sectional view for explaining another example of a fixing part using the bent portions 25, 25 of the radiator plates 12a, 12b.

Therefore, by caulking process of crushing the tip of the projection 21 of the radiator plate 12b inserted into the inserting slot 30a of the radiator plate 12a, the crushed area 21a having a larger diameter than the inserting slot 30a can be formed. The crushed area 21a is engaged with the stepped face 34a so that the radiator plates 12a, 12b and the circuit board 11 are firmly caulked.

In the circuit board 11 shown in FIGS. 1 to 13, the upper surfaces of the semiconductor elements 17, 17, . . . loaded are substantially flush with one another. However, as seen from FIG. 14, as the case may be, the upper surface of the semiconductor element 17a loaded at a nearly center position of the circuit board 11 is higher than those of the other semiconductor elements 17, 17, . . . . The semiconductor element 17a shown in FIG. 14 is loaded on a substrate 16 placed at the center position of the circuit board 11, and its upper surface is higher than those of the other semiconductor elements 17, 17, . . . directly loaded on the circuit board 11.

Figure 14:
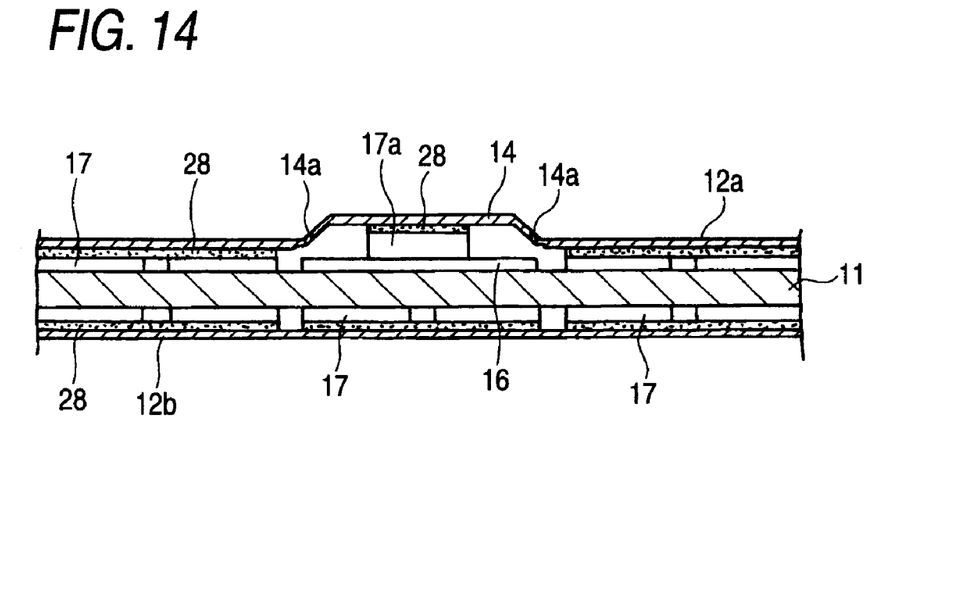
FIG. 14 is a partial longitudinal sectional view for explaining another example of the semiconductor module according to this invention.

In this case, as seen from FIG. 14, the center area 14 of the radiator plate 12a put on the upper surface of the semiconductor element 17a is bent so that it is higher than the remaining area. The vicinity of the center area on which the radiator plate 12a is bent, both sides of which are formed of flat plate-like planes, can be easily bent.

When the radiator plate 12a is attached to the one side of the circuit board 11, as seen from FIG. 14, the upper surface of the semiconductor element 17a and the corresponding face of the center area 14 of the radiator plate 12a can be connected to each other through the thermal-conductive tape 28.

Further, where the semiconductor element 17a is a high-heat semiconductor element which generates more heat than the other semiconductor elements 17, 17, . . . , heat dissipation by only the radiator plate 12a is insufficient and so the temperature of the surrounding atmosphere of the semiconductor element 17a may rise. In this case, by forming a plurality of air vents 14a, 14a, . . . in the vicinity of the outer peripheral edge of the area (center area 14) of the radiator plate 12a abutting on the upper surface of the semiconductor element 17a, heat accumulated in the surrounding atmosphere of the semiconductor element 17a can be dissipated quickly.

Figure 15:
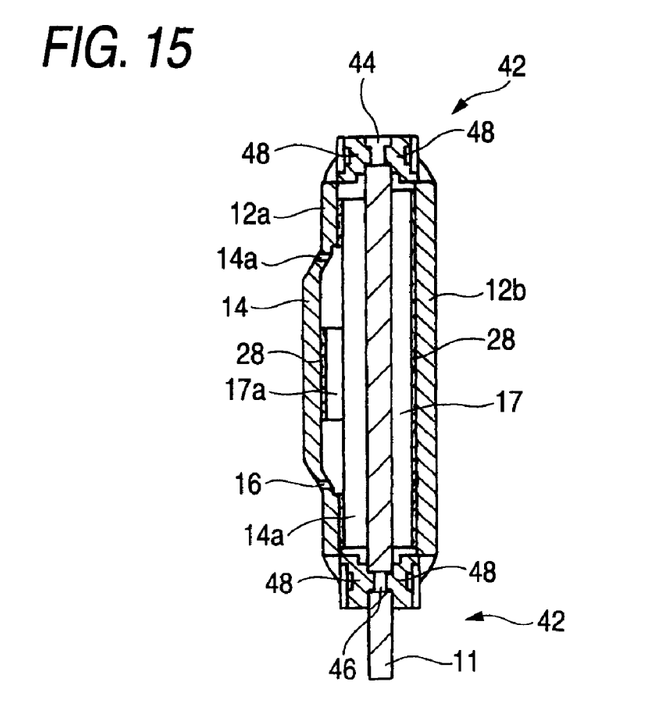
FIG. 15 is a partial transverse sectional view of the semiconductor module shown in FIG. 14.

As seen from FIG. 14, even where the center area 14 of the radiator plate 12a is bent to be higher than the remaining area thereof, as means for attaching the radiator plates 12a, 12b to the circuit board 11, the pair of attachments 42, 42 as shown in FIG. 15 are employed. This pair of attachments 42, 42, which have the same configuration as the pair of attachments 42, 42 shown in FIG. 2, will not be explained in detail. Even where this pair of attachments 42, 42 are constructed as shown in FIG. 3, using the clips 40, 40, together, the radiator plates 12a, 12b can be firmly attached to the circuit board 11. On the other hand, if the pair of attachments 42, 42 are constructed as shown in FIGS. 4 to 7, the clips 40, 40,... becomes unnecessary.

Further, as shown in FIGS. 8 to 13, by using the bent portions 25, 25 of the radiator plates 12a, 12b, the radiator plates 12a, 12b shown in FIGS. 14 and 15 can be firmly attached to the circuit board 11 without using the clips 40.

What is claimed is:

1. A semiconductor module comprising:
   a rectangular circuit board comprising a conductive circuit having a via and a wiring pattern on a board surface thereof;
   semiconductor elements provided on both surfaces of the circuit board;
   rectangular radiator plates that are attached to the respective surfaces of the circuit board and that covers upper surfaces of the semiconductor elements so that outer peripheral edges of the radiator plate does not project from the circuit board; and
   a through hole or a notch formed on a portion of the circuit board, the portion being positioned at a longitudinally center area and a vicinity of the outer peripheral edge where the conductive circuit is not formed,
   wherein
   a part in the vicinity of the outer peripheral edge of each the radiator plates is bent so as to abut on the board surface in the vicinity of the outer peripheral edge of the circuit board,
   a projection projecting toward the through-hole or the notch is formed at a position of the radiator plate corresponding to the through-hole or the notch of the circuit board,
   the projection is engaged into the through-hole or the notch directly or by an engaging member so that the radiator plate is located at a predetermined position of the circuit board, and
   a part of the projection abuts on the corresponding board surface of the circuit board.

2. The semiconductor module according to claim 1, wherein
   the projection is engaged into the through-hole or notch directly or by an engaging member at two points.

3. The semiconductor module according to claim 1, wherein a tip of the projection of each the radiator plates is inserted into the through-hole or notch formed in the circuit board so that each the radiator plates is located at a predetermined position of the circuit board and the remaining portion of the projection abuts on the corresponding board surface of the circuit board.

4. The semiconductor module according to claim 1, wherein the radiator plates are attached on both sides of the circuit board by a clip.

5. The semiconductor module according to claim 4, wherein notch grooves are formed on the circuit board and the radiator plates so that an outer peripheral edge of the clips is not projected from the outer peripheral edge of the circuit board when the clips are mounted.

6. The semiconductor module according to claim 1, wherein
   an attaching structure of the circuit board and the radiator plates comprises:
   the attachment hole formed at an attaching edge where which is positioned a vicinity of the outer peripheral edge of the circuit board and where the conductive circuit is not formed; and
   a securing part that is formed of respective portions of the radiator plates corresponding to the attachment hole and that caulks the radiator plates to the circuit board through the attachment hole.

7. The semiconductor module according to claim 1, wherein among the semiconductor elements arranged along with the longitudinal direction of the circuit board, the upper surface of one of the semiconductor elements positioned in the vicinity of the center area of the circuit board is located at a position higher than those of the other semiconductor elements, and
   the vicinity of the center area of the radiator plates is bent so as to abut on the upper surface of the semiconductor element in the vicinity of the center area of the circuit board.

8. The semiconductor module according to claim 1, wherein among the semiconductor elements arranged along with the longitudinal direction of the circuit board, one of them is a high-heat semiconductor element generating more heat than the other semiconductor elements, and
   at least one air bent is formed in a vicinity of an outer peripheral edge of an area of the radiator plates contacting with an upper surface of the high-heat semiconductor element.

9. A radiator plate for a semiconductor module,
   wherein the rectangular radiator plate is attached to both surfaces of a board circuit so as to cover upper surfaces of semiconductor elements arranged on both surfaces of a rectangular board circuit, on which a conductive circuit having a via and a wiring patter formed, in such a manner that an outer peripheral edge of the radiator plate does not protrude from the circuit board,
   a part of the radiator in a vicinity of the outer peripheral edge of the radiator plates is bent so as to abut on the board surface in a vicinity of the outer peripheral edge of the circuit board,
   a projection projecting toward the circuit board is formed on the radiator plate at a position corresponding to a through-hole or a notch, which is formed on the circuit board at a position in a vicinity of a longitudinally center area and a vicinity where the conductive circuit is not formed, so that the radiator plates is located at a predetermined position of the circuit board.

10. The radiator plate according to claim 9, wherein when the radiator plate is attached to the board surface of the circuit board,
    a tip of the projection formed on the radiator plate is formed as an insertion portion, which is inserted into the through-hole or the notch of the circuit board, and
    the remaining part of the radiator plate is formed as an abutment surface, which abuts on the corresponding board surface of the circuit board.

11. The semiconductor module according to claim 1, wherein a thermal conductive member is disposed between the radiator plate and the semiconductor element.

* * * * *